(12) United States Patent
Hayakawa et al.

(10) Patent No.: US 8,859,993 B2
(45) Date of Patent: Oct. 14, 2014

(54) SAMPLE HOLDER OF ELECTRON BEAM EXPOSURE APPARATUS AND ELECTRON BEAM EXPOSURE METHOD USING THE SAME

(71) Applicant: Advantest Corporation, Tokyo (JP)

(72) Inventors: Hirofumi Hayakawa, Tokyo (JP); Akiyoshi Tsuda, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 13/967,970

(22) Filed: Aug. 15, 2013

(65) Prior Publication Data
US 2014/0048720 A1 Feb. 20, 2014

(30) Foreign Application Priority Data
Aug. 15, 2012 (JP) .................................. 2012-180047

(51) Int. Cl.
*H01J 37/20* (2006.01)
*H01J 37/317* (2006.01)
(52) U.S. Cl.
CPC ............. *H01J 37/20* (2013.01); *H01J 37/3174* (2013.01)
USPC ................................... 250/442.11

(58) Field of Classification Search
USPC ....................... 250/442.11, 440.11
See application file for complete search history.

(56) References Cited

U.S. PATENT DOCUMENTS 8,124,539 B2 * 2/2012 Endoh et al. ................... 438/714
8,519,332 B2 * 8/2013 Miya et al. ..................... 250/306
8,653,455 B2 * 2/2014 Kitsunai et al. ................ 250/306

FOREIGN PATENT DOCUMENTS

JP 2004-140297 5/2004
JP 2008-021686 1/2008
JP 2010-282825 12/2010

* cited by examiner

*Primary Examiner* — Kiet T Nguyen
(74) *Attorney, Agent, or Firm* — Muramatsu & Associates

(57) ABSTRACT

A sample holder to be disposed between an electrostatic chuck and a sample smaller than the upper surface of the electrostatic chuck is provided, the sample holder including: a base plate formed in the same size as the upper surface of the electrostatic chuck; a sample placement portion located on the upper surface of the base plate, and designed to place the sample thereon; and a circumferential portion being a portion of the upper surface of the base plate other than the sample placement portion, and having a conductive material exposed to the outside.

11 Claims, 9 Drawing Sheets

SAMPLE HOLDER OF ELECTRON BEAM EXPOSURE APPARATUS AND ELECTRON BEAM EXPOSURE METHOD USING THE SAME

CROSS-REFERENCE TO RELATED APPLICATION

This application is based upon and claims and the benefit of priority of the prior Japanese Patent Application NO. 2012-180047, filed Aug. 15, 2012, the entire contents of which are incorporated herein by reference.

FIELD

The embodiments discussed herein are related to a sample holder for electron beam exposure to be used while disposed between a sample and an electrostatic chuck, and an electron beam exposure method using the same.

BACKGROUND

An electron beam exposure apparatus fixes a wafer to be exposed and corrects its flatness by electrostatically attracting and hold the wafer with an electrostatic chuck.

However, if a wafer with a diameter smaller than that of the electrostatic chuck is placed on the electrostatic chuck and exposed, the following problem occurs. Specifically, electric charges accumulate in a dielectric exposed to the outside in a surface of the electrostatic chuck, which causes a charge-up phenomenon. Then, an electric field generated by the charge-up phenomenon bends an electron beam, so that exposure accuracy deteriorates.

To cope with this, in a conventional electron beam exposure apparatus, an electrostatic chuck is made in conformity with the size of a wafer to be exposed to prevent a dielectric from being exposed to the outside around the wafer.

However, when samples in different sizes are intended to be exposed, the above method requires electrostatic chucks to be changed, and thus requires the apparatus to be modified in a large scale.

The conventional technique therefore has a problem of being unable to easily meet the need for electron beam exposure to samples in various shapes in, for example, trial production.

Patent Document 1: Japanese Laid-Open Patent Publication No. 2008-21686
Patent Document 2: Japanese Laid-Open Patent Publication No. 2004-140297
Patent Document 3: Japanese Laid-Open Patent Publication No. 2010-282825

SUMMARY

An objective of the present invention is to provide a sample holder which enables accurate electron beam exposure to wafers in various shapes with a single common electrostatic chuck, and an electron beam exposure method using the same.

A viewpoint of the following disclosure provides a sample holder to be disposed between an electrostatic chuck and a sample smaller than the upper surface of the electrostatic chuck, the sample holder including: a base plate formed in the same size as the upper surface of the electrostatic chuck; a sample placement portion located on the upper surface of the base plate, and designed to place the sample thereon; and a circumferential portion being a portion of the upper surface of the base plate other than the sample placement portion, and having a conductive material exposed to the outside.

Another viewpoint thereof provides an electron beam exposure method using a sample holder including: a base plate formed in the same size as the upper surface of an electrostatic chuck; a sample placement portion being located on the upper surface of the base plate, and designed to place a sample thereon; and a circumferential portion being a portion of the upper surface of the base plate other than the sample placement portion, and having a conductive material exposed to the outside, the method including the steps of: placing the sample on the sample holder; disposing the sample holder with the sample placed thereon on the electrostatic chuck, and fixing the sample holder on the electrostatic chuck by applying a voltage to the electrostatic chuck; and carrying out pattern lithography by irradiating the sample disposed on the electrostatic chuck with an electron beam.

According to the above aspects, in the sample holder, the conductive material is exposed to the outside in the circumferential portion around the sample placement portion for placing the sample thereon. Accordingly, electric charges generated in the irradiation with the electron beam can be released to the outside by way of the conductive material, so that a charge-up phenomenon can be prevented. Thereby, electron beam lithography can be carried out accurately on a sample having a planar shape smaller than the electrostatic chuck.

Thus, only by preparing a sample holder corresponding to the shape of a sample measured first, electron beam exposure can be carried out on samples of various shapes without any large-scale work such as modification of an electrostatic chuck of an electron beam exposure apparatus.

DESCRIPTION OF EMBODIMENTS

First Embodiment

Figure 1:
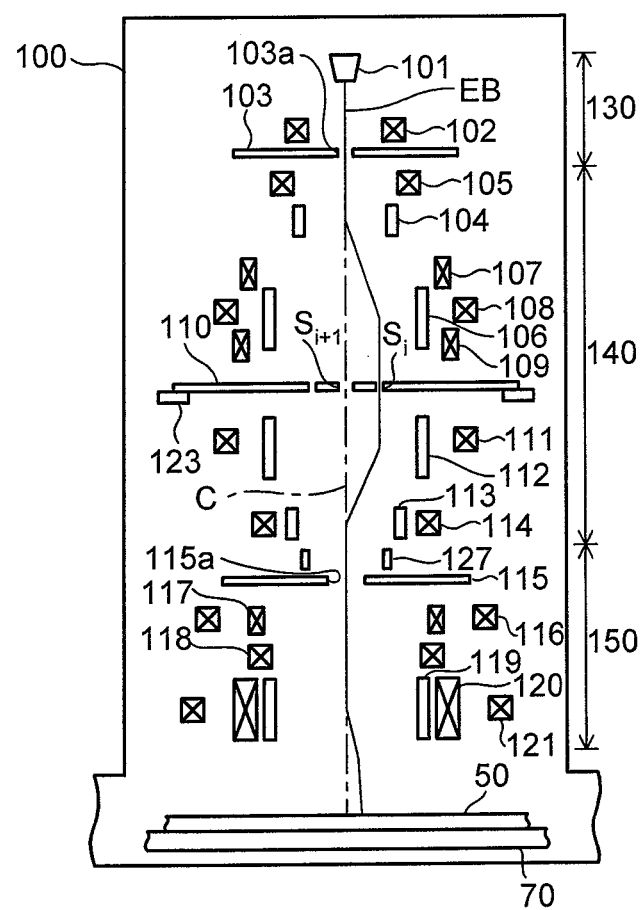
FIG. 1 is a block diagram of an electron beam exposure apparatus.

FIG. 1 is a block diagram of an electron beam exposure apparatus.

As illustrated in FIG. 1, an electron beam exposure apparatus 100 includes an electron beam generation portion 130, a mask deflection portion 140, and a substrate deflection portion 150.

In the electron beam generation portion 130, electrons emitted from an electron gun 101 are made to converge by first electron lens 102 and formed into an electron beam EB having predetermined current density. The electron beam EB passes through a rectangular aperture 103a of a beam shaping mask 103 and is thereby shaped to have a rectangular cross section.

After that, the electron beam EB is subjected to a convergence effect of a second electron lens 105 of the mask deflection portion 140, and is then deflected by a first electrostatic deflector 104 and a second electrostatic deflector 106 to form an image of a predetermined pattern $S_i$ of an exposure mask 110. A third electromagnetic lens 108 and a fourth electron lens 111 disposed above and below the exposure mask 110 play a function of making the electron beam EB form an image on a wafer.

The electron beam EB passes through the exposure mask 110, and the cross section of the electron beam EB is thus shaped into the form similar to the pattern Si.

The electron beam EB having passed through the exposure mask 110 is deflected back to an optical axis C by a third electrostatic deflector 112 and a fourth electrostatic deflector 113, and is reduced in size by a fifth electromagnetic lens 114. The deflection aberration of the electron beam EB caused by the electrostatic deflectors 104, 106, 112, 113 of the mask deflection portion 140 is corrected by a first correction coil 107 and a second correction coil 109.

Thereafter, the electron beam EB passes through an aperture 115a of a shield 115, and is then deflected to a predetermined position on a wafer 50 by a sub deflector 119 and a main deflector 120. A third correction coil 117 and a fourth correction coil 118 correct the deflection aberration of the beam caused by the deflectors 119, 120. A first electromagnetic projection lens 116 and a second electromagnetic projection lens 121 play a function of making the electron beam EB form an image on a surface of the wafer 50.

A stage 70 fixes the wafer 50 thereto with an electrostatic chuck to be described later, and moves the wafer 50 to a predetermined position with a drive mechanism not illustrated.

Figure 2:
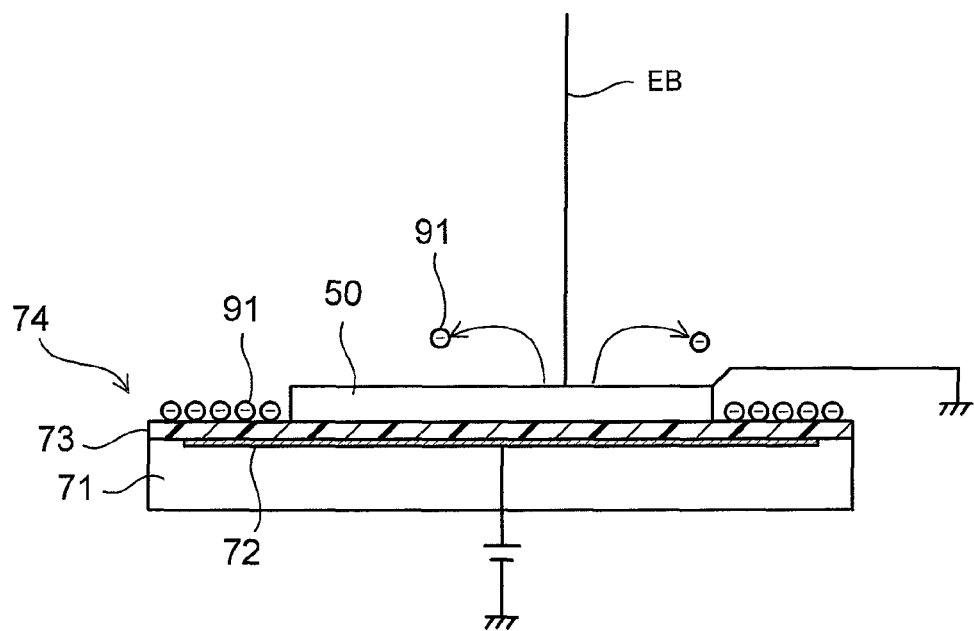
FIG. 2 is a schematic diagram illustrating a problem caused when a sample smaller than an electrostatic chuck is irradiated with an electron beam.

FIG. 2 is a diagram illustrating a problem caused when a sample smaller than an electrostatic chuck is irradiated with an electron beam.

As illustrated in FIG. 2, an electrostatic chuck 74 includes: a base member 71 made of an insulating material such as ceramics; an electrode 72 formed in an upper surface of the base member 71; and a dielectric layer 73 covering the upper surfaces of the base member 71 and the electrode 72. A surface of the dielectric layer 73 is formed flat, and the wafer (sample) 50 to be exposed is placed on the dielectric layer 73.

By applying a predetermined voltage, 2 kV for example, to the electrode 72, electrostatic polarization is caused in the wafer 50 through the dielectric layer 73 and electrostatic attraction force acts on the wafer 50 and the electrode 72, whereby the wafer 50 is fixed to the electrostatic chuck 74.

Such electrostatic attraction force corrects the warp of the wafer 50 and makes uniform the position of the wafer 50 in its thickness direction throughout all parts of the wafer 50, which enables accurate exposure.

However, if the wafer 50 smaller than the electrostatic chuck 74 is placed on the electrostatic chuck 74 as illustrated in FIG. 2, the dielectric layer 73 is exposed to the outside around the wafer 50. Although the electron beam EB is irradiated only on predefined positions on the surface of the wafer 50, secondary electrons 91 are generated with this irradiation, and some of the secondary electrons 91 are partially attracted to the dielectric layer 73. This causes a problem that a charge-up phenomenon occurs around the wafer 50 and the accuracy in the irradiation position of the electron beam EB deteriorates.

To address this problem, in this embodiment, the wafer 50 is placed on the electrostatic chuck 74 with a sample holder to be described below interposed in between.

Figure 3A:
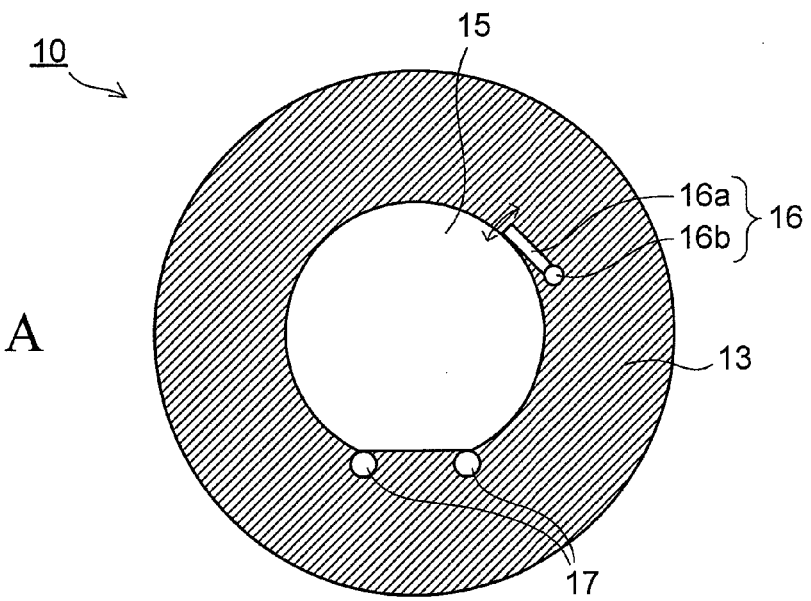
FIG. 3A is a plan view of a sample holder according to a first embodiment.
Figure 3B:
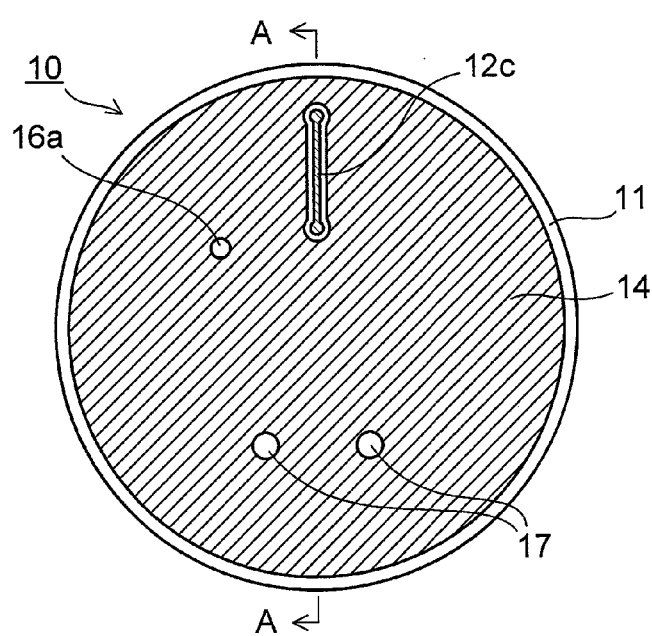
FIG. 3B is a bottom view of the sample holder according to the first embodiment.
Figure 4A:
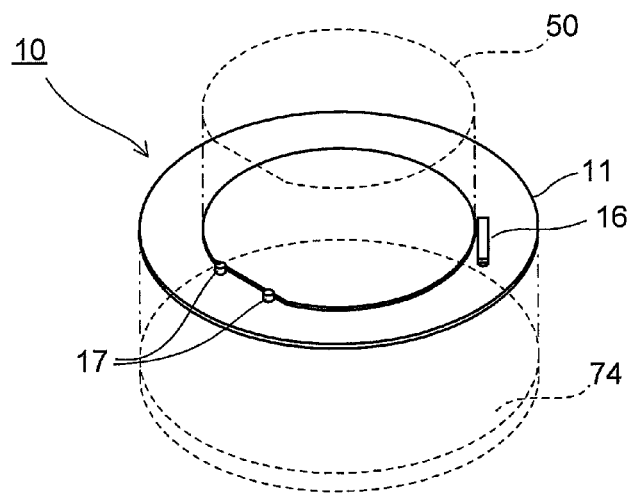
FIG. 4A is a perspective view of the sample holder according to the first embodiment.
Figure 4B:
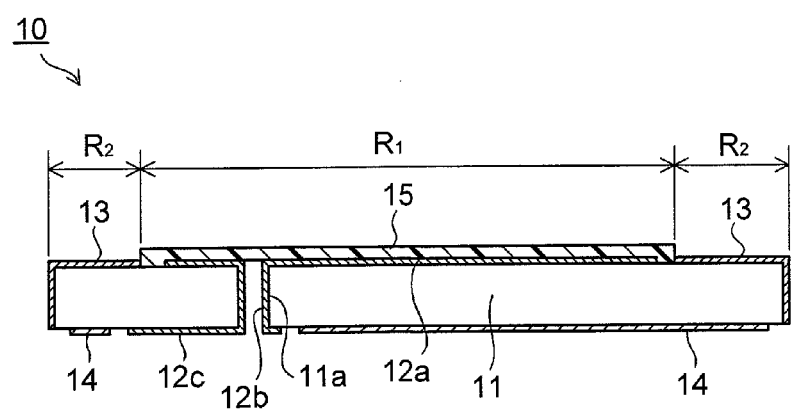
FIG. 4B is a cross-sectional view of the sample holder taken along the line A-A of FIG. 3B.

FIG. 3A is a plan view of the sample holder according to the first embodiment. FIG. 3B is a bottom view of the sample holder according to the first embodiment. FIG. 4A is a perspective view of the sample holder illustrated in FIGS. 3A and 3B. FIG. 4B is a cross-sectional view of the sample holder taken along the line A-A of FIG. 3B.

As illustrated in FIG. 4A, a sample holder 10 according to this embodiment includes a base plate 11 formed to have substantially the same shape as the electrostatic chuck 74 of the electron beam exposure apparatus 100. The base plate 11 is made of an insulating material such as alumina ceramics.

As illustrated in the cross-sectional view of FIG. 4B, a first electrode 12a made of a conductive material is formed in a sample placement portion $R_1$ located on the upper surface of the base plate 11 and designed to place the wafer 50 thereon. A dielectric plate (insulating member) 15 made of a dielectric material is fixed to the first electrode 12a by way of bonding or the like.

The first electrode 12a is formed slightly smaller than the sample placement portion $R_1$, and is isolated from an antistatic film 13 formed in a circumferential portion $R_2$. As illustrated in FIG. 4A, the dielectric plate 15 is formed to have substantially the same shape as the wafer 50 to be placed thereon. As the dielectric plate 15, a dielectric material such as a sapphire substrate may be used.

As illustrated in FIG. 4B, a through-hole 11a is formed in the base plate 11. Through a conductive film 12b formed on the inner circumferential surface of the through-hole 11a, the first electrode 12a is electrically connected to a power feeding pad 12c formed on the bottom surface of the base plate 11.

In addition, as illustrated in FIGS. 3A and 4B, the antistatic film 13 covers the side surface of the base plate 11 and the circumferential portion $R_2$ which is located on the upper surface of the base plate 11 and outside the sample placement portion $R_1$. The antistatic film 13 is made of a conductive material, and is electrically insulated from the first electrode 12a.

As illustrated in FIGS. 3B and 4B, a second electrode 14 is formed on the bottom surface of the base plate 11. The second electrode 14 covers a large portion of the bottom surface of the base plate 11, but is isolated from the antistatic film 13 and the power feeding pad 12c. Thereby, the second electrode 14 is electrically insulated from the first electrode 12a and the antistatic film 13.

Here, the first electrode 12a, the antistatic film 13, the power feeding pad 12c, and the second electrode 14 may be formed by: forming a film made of a conductive material such as a titanium nitride film (TiN) on the entire surface of the base plate 11; and then removing predetermined portions by an etching method or the like.

Further, as illustrated in FIG. 3A, a positioning mechanism configured to position the wafer 50 and including pins 17 and a lever mechanism 16 is provided around the sample placement portion of the base plate 11. The lever mechanism 16 turns about a shaft 16b in a direction indicated by an arrow, and a lever 16a presses the wafer 50 with the biasing force of a spring. Thereby, the wafer 50 is restrained by the pins 17 and the lever mechanism 16, and positioned at a predetermined position.

Hereinbelow, an operation of the sample holder 10 will be described together with an electron beam exposure method using the sample holder 10.

Figure 5A:
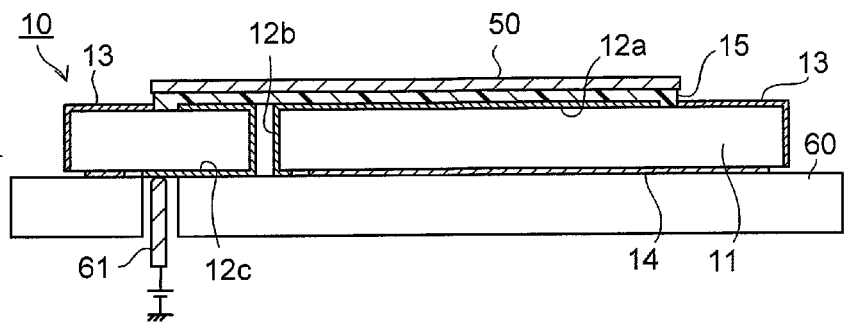
FIGS. 5A to 5C are diagrams illustrating an electron beam exposure method using the sample holder according to the first embodiment.
Figure 5B:
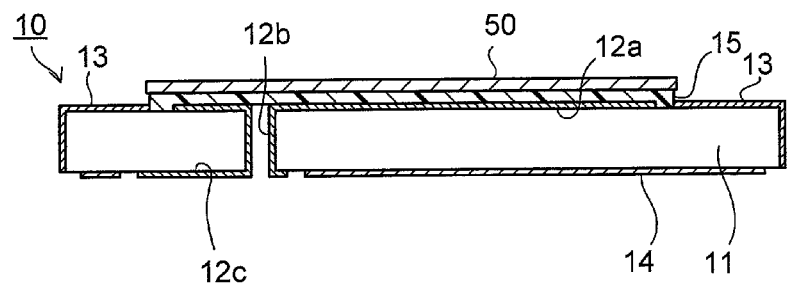
Figure 5C:
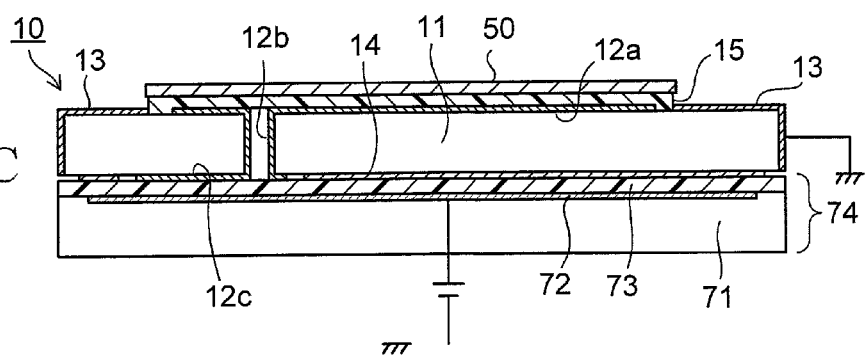

FIGS. 5A to 5C are diagrams illustrating the electron beam exposure method using the sample holder 10.

First, as illustrated in FIG. 5A, the sample holder 10 according to this embodiment is placed on a stage 60 for placing the wafer thereon. The stage 60 is provided with an electrode terminal 61 in a portion corresponding to the power feeding pad 12c of the sample holder 10. The electrode terminal 61 and the power feeding pad 12c are electrically connected to each other.

Next, the wafer 50 is disposed on the dielectric plate 15 of the sample holder 10. Then, a predetermined voltage (2 kV for example) is applied to the first electrode 12a of the sample holder 10 through the electrode terminal 61 and the power feeding pad 12c.

Thereby, electrostatic polarization is caused in the wafer 50 through the dielectric plate 15, and electrostatic attraction force acts on the first electrode 12a and the wafer 50. Thus, the wafer 50 is pressed against the dielectric plate 15, so that the warp of the wafer 50 in its thickness direction is corrected and the wafer 50 is fixed to the sample holder 10.

After that, as illustrated in FIG. 5B, the sample holder 10 is detached from the stage 60 by using a conveyance device, for example. In this event, the electrostatic attraction force keeps acting on the wafer 50 with the electric charges remaining in the first electrode 12a of the sample holder 10. Thus, the sample holder 10 can be conveyed while the wafer 50 is stably held on the sample holder 10.

Subsequently, as illustrated in FIG. 5C, the sample holder 10 is disposed on the electrostatic chuck 74 of the electron beam exposure apparatus 100. Thereby, the upside of the dielectric layer 73 of the electrostatic chuck 74 is covered with the wafer 50 and the antistatic film 13.

Next, a predetermined voltage is applied to the electrode 72 of the electrostatic chuck 74. Thereby, electrostatic attraction force acts on the second electrode 14 of the sample holder 10 and the electrode 72 of the electrostatic chuck 74, and corrects the warp of the sample holder 10. Since the wafer 50 is attracted onto the sample holder with the electric charges remaining in the first electrode 12a, the correction of the warp of the sample holder 10 further improves the flatness of the wafer 50.

Subsequently, the antistatic film 13 formed in the circumferential portion $R_2$ of the sample holder 10 is grounded.

After that, the stage 70 is driven to move the wafer 50 to a predetermined position, and then the electron beam exposure apparatus 100 irradiates a surface of the sample with the electron beam for pattern lithography.

According to the electron beam exposure method of this embodiment, the dielectric layer 73 of the electrostatic chuck 74 is covered with the antistatic film 13 of the sample holder 10. Accordingly, secondary electrons generated by the irradiation with the electron beam can be released to the outside by way of the antistatic film 13, so that a charge-up phenomenon around the wafer 50 can be prevented.

Thus, this embodiment makes it possible to carry out electron beam exposure on the wafer 50 smaller than the electrostatic chuck 74 accurately without any large-scale work such as the modification of the electrostatic chuck 74.

Note that, in the electron beam exposure method of this embodiment, the attraction of the sample holder 10 by the electrostatic chuck 74 and the attraction of the wafer 50 by the sample holder 10 may be performed at the same time, as will be described in the following modification.

Modification of First Embodiment

Figure 6A:
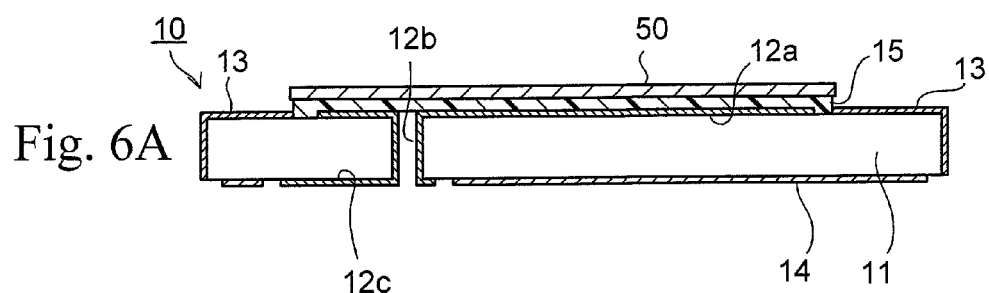
FIGS. 6A and 6B are diagrams illustrating an electron beam exposure method according to a modification of the first embodiment.
Figure 6B:
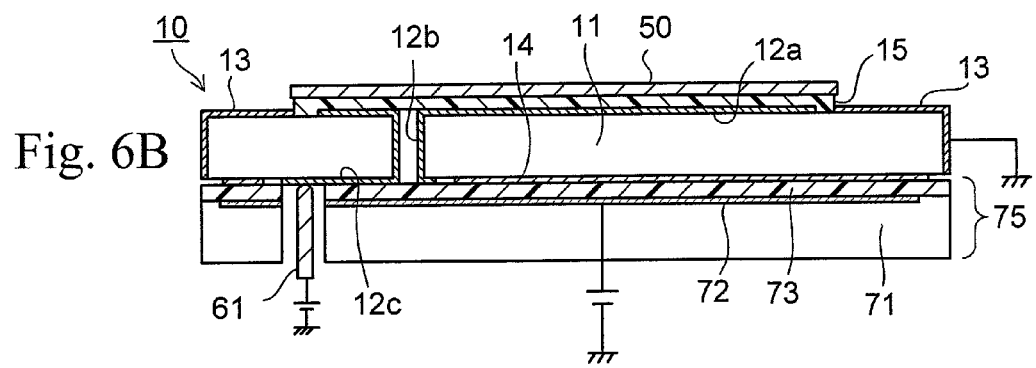

FIGS. 6A and 6B are diagrams illustrating an electron beam exposure method according to a modification of the first embodiment.

In this modification, first of all, the wafer 50 is placed on the dielectric plate 15 of the sample holder 10, as illustrated in FIG. 6A. In this step, the sample holder 10 having the wafer 50 placed thereon is conveyed onto an electrostatic chuck 75 without applying a voltage to the first electrode 12a.

Next, as illustrated in FIG. 6B, the sample holder 10 is placed on the electrostatic chuck 75. The electrostatic chuck 75 of this modification is provided with the electrode terminal 61 in a portion corresponding to the power feeding pad 12c of the sample holder 10. The electrode terminal 61 and the power feeding pad 12c are brought into electrical contact with each other.

Subsequently, a voltage, 1.2 kV for example, is applied to the electrode 72 of the electrostatic chuck 75, and a voltage, 0.8 kV for example, is applied to the first electrode 12a of the sample holder 10 through the electrode terminal 61 and the power feeding pad 12c.

Thereby, the warp of the sample holder 10 and the wafer 50 is corrected and the flatness of the wafer 50 is improved.

After that, the antistatic film 13 of the sample holder 10 is grounded. Then, the electron beam is irradiated on a predetermined portion of the wafer 50 for lithography.

Effects similar to those of the electron beam exposure method described with reference to FIGS. 5A to 5C can be obtained with the above modification as well.

Second Embodiment

Figure 7A:
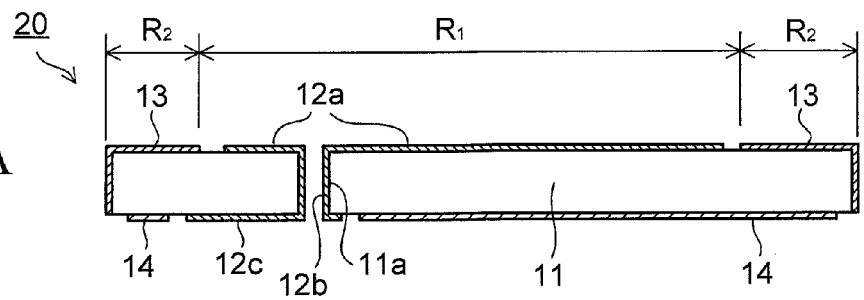
FIG. 7A is a cross-sectional view of a sample holder according to a second embodiment.
Figure 7B:
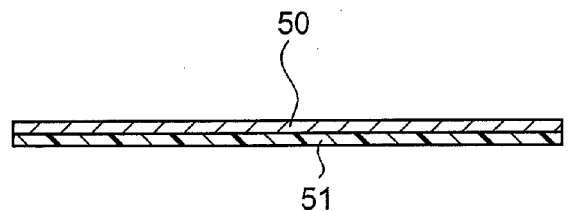
FIG. 7B is a cross-sectional view of a sample used with the sample holder of FIG. 7A.
Figure 7C:
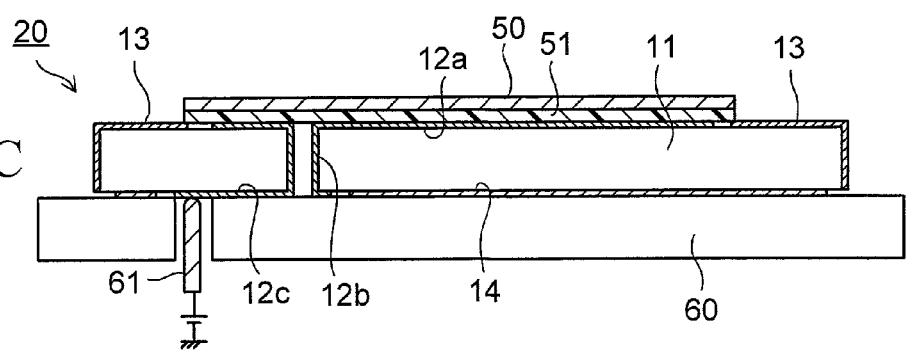
FIG. 7C is a cross-sectional view illustrating how to fix the sample with the sample holder illustrated in FIG. 7A.

FIG. 7A is a cross-sectional view of a sample holder according to a second embodiment. FIG. 7B is a cross-sectional view of a sample used in the second embodiment. FIG. 7C is a cross-sectional view illustrating how to fix the sample illustrated in FIG. 7B with the sample holder illustrated in FIG. 7A.

As illustrated in FIG. 7A, a sample holder 20 of this embodiment is the same as the sample holder 10 illustrated in FIGS. 3A to 4B, except for the point that no dielectric plate 15 (see FIG. 4B) is disposed on the first electrode 12a. Note that constituents of the sample holder 20 having the same structure as those of the sample holder 10 are given the same reference signs and detailed description thereof will be omitted.

As illustrated in FIG. 7B, in this embodiment, a dielectric film 51 is formed on the back surface of the wafer 50 instead of the dielectric plate 15. The dielectric film 51 is formed by applying a resin such as a polyimide resin to the back surface of the wafer 50 with a spin coating method or the like.

As illustrated in FIG. 7C, the wafer 50 is placed on the sample holder 20 with the surface of the wafer 50, on which the dielectric film 51 is formed, facing down. Then, a predetermined voltage is applied to the first electrode 12a through the power feeding pad 12c to cause electrostatic polarization in the wafer 50 through the dielectric film 51. Thereby, the wafer 50 is attracted onto the sample holder 20.

After that, the sample holder 20 is attracted onto the electrostatic chuck 74 with the method described with reference to FIGS. 5B and 5C, whereby electron beam exposure can be carried out.

This embodiment also makes it possible to carry out electron beam exposure on the wafer 50 smaller than the electrostatic chuck 74 accurately without any large-scale work such as modification of the electrostatic chuck 74.

Third Embodiment

Figure 8A:
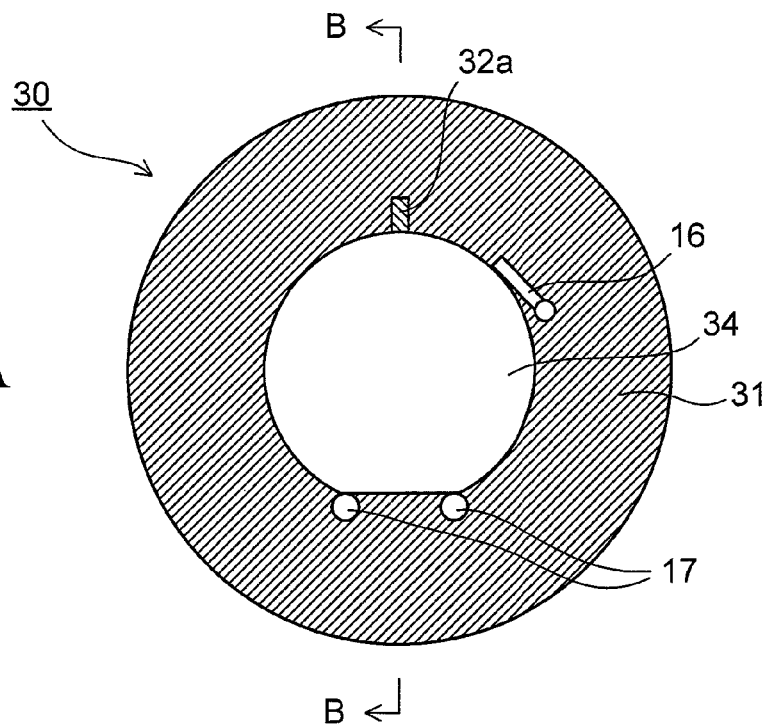
FIG. 8A is a plan view of a sample holder according to a third embodiment.
Figure 8B:
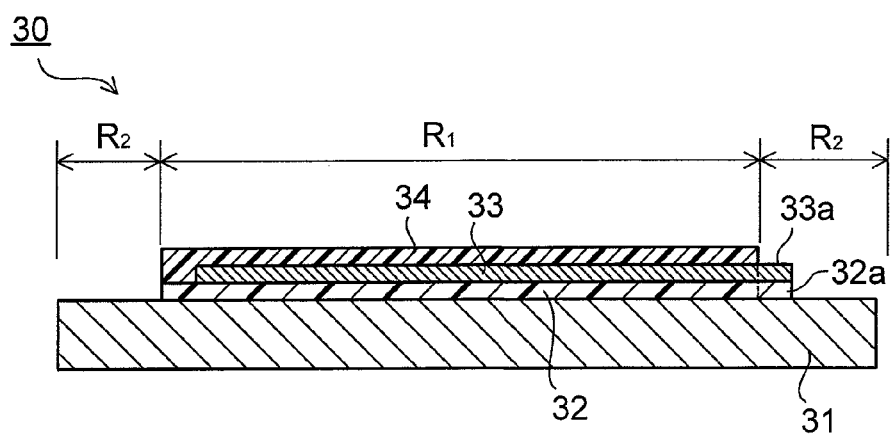
FIG. 8B is a cross-sectional view of the sample holder taken along the line B-B of FIG. 8A.

FIG. 8A is a plan view of a sample holder 30 according to a third embodiment. FIG. 8B is a cross-sectional view of the sample holder 30 taken along the line B-B of FIG. 8A.

As illustrated in FIG. 8A, the sample holder 30 of this embodiment differs from the sample holder 10 described with reference to FIGS. 3A to 4B in that a base plate 31 is made of a conductive material such as a silicon substrate. The base plate 31 is formed in the same shape as the electrostatic chuck 74 to be used, and its circumferential portion is exposed to the outside. In addition, a sample placement portion for placing the wafer 50 thereon is covered with a second dielectric film 34.

The pins 17 and the lever mechanism 16 provided in the circumferential portion of the base plate are the same as the pins 17 and the level mechanism 16 of the sample holder 10 described with reference to FIGS. 3A to 4B.

As illustrated in FIG. 8B, a first dielectric film 32 is formed in the sample placement portion R₁ on the upper surface of the base plate 31 of the sample holder 30, and a first electrode 33 is formed on the first dielectric film 32.

The first dielectric film 32 is formed in the same shape as the wafer 50 to be placed. On the other hand, the first electrode 33 has a diameter smaller than those of the first dielectric film 32 and the second dielectric film 34, and is formed not to be exposed to the outside from the side portion of the sample placement portion R₁.

However, portions of the first dielectric film 32 and the first electrode 33 are extension portions 32a, 33a protruding from the sample placement portion R₁. The extension portion 33a of the first electrode 33 is exposed to the outside, whereby an external electrode terminal can be connected to the first electrode 33.

The first dielectric film 32 and the first electrode 33 in the sample placement portion R₁ are covered with the second dielectric film 34. The second dielectric film 34 is formed in the same shape as the wafer 50 to be placed.

The first dielectric film 32, the first electrode 33, and the second dielectric film 34 may be formed by attaching resin films or metal foils formed in a predetermined shape sequentially onto the base plate 31. Instead, they may be made by repeating film formation processes and etching processes using a mask.

Hereinbelow, an electron beam exposure method using the sample holder 30 according to this embodiment will be described.

Figure 9A:
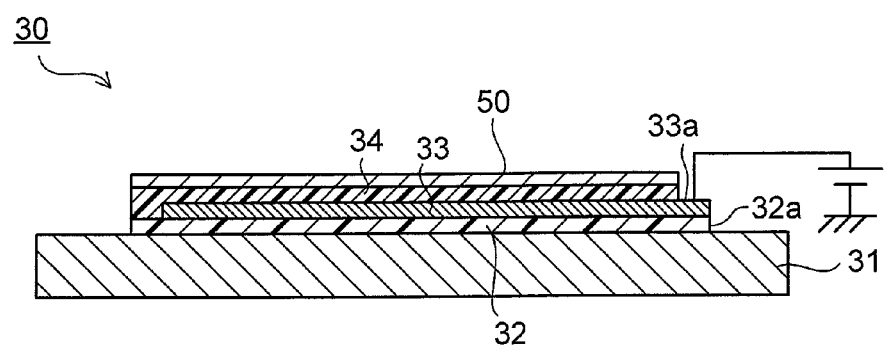
FIGS. 9A and 9B are cross-sectional views illustrating an electron beam exposure method using the sample holder according to the third embodiment.
Figure 9B:
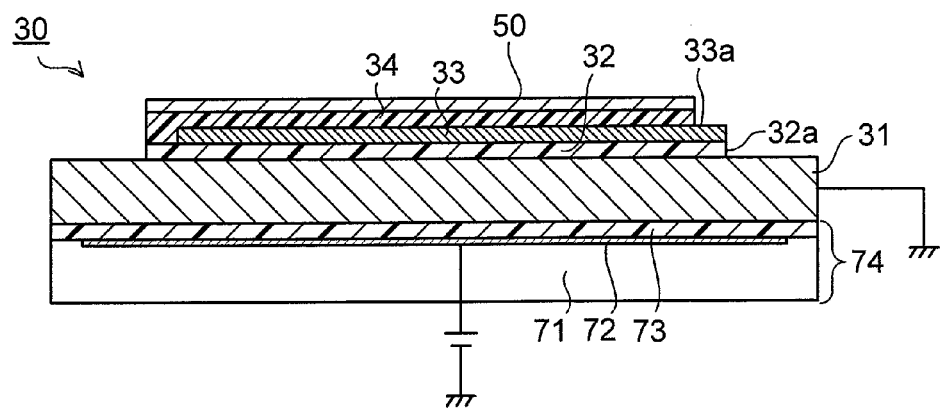

FIGS. 9A and 9B are cross-sectional views illustrating the electron beam exposure method using the sample holder 30.

First, as illustrated in FIG. 9A, the wafer 50 is placed on the sample holder 30. Next, the wafer 50 is attracted and fixed onto the sample holder 30 by applying a predetermined voltage (2 kV, for example) to the first electrode 33 through the extension portion 33a. Thereby, the warp of the wafer 50 is corrected.

Subsequently, as illustrated in FIG. 9B, the sample holder 30 having the wafer 50 fixed thereto is disposed on the electrostatic chuck 74, and a voltage is applied to the electrode 72 of the electrostatic chuck 74. Thus, the sample holder 30 is attracted onto the electrostatic chuck 74, and the warp of the wafer 50 is corrected together with the warp of the sample holder 30, whereby the flatness of the wafer 50 is further improved.

Here, the dielectric layer 73 in the upper surface of the electrostatic chuck 74 is covered with the base plate 31 made of silicon.

After that, the silicon base plate 31 is grounded, and then the electron beam is irradiated on a predetermined portion of the wafer 50 for exposure.

In this embodiment, the dielectric film 73 in the surface of the electrostatic chuck 74 is covered with the silicon base plate 31 of the sample holder 30. Accordingly, secondary electrons generated by the irradiation with the electron beam can be released to the outside by way of the base plate 31, so that a charge-up phenomenon around the wafer 50 can be prevented.

Thus, the exposure of the wafer 50 can be carried out accurately.

Note that, although the example where the base plate 31 of the sample holder 30 is made of silicon is shown in the above description, this embodiment is not limited to this. Alternatively, the base plate 31 may be made of a conductive metal or semiconductor other than silicon.

Further, in this embodiment, the first dielectric film 32, the first electrode 33, and the second dielectric film 34 do not necessarily have to be provided if the accuracy of electron beam exposure may be low and the warp of the wafer 50 does not have to be corrected. In this case, a charge-up phenomenon around the wafer 50 can be prevented only by placing the wafer 50 directly on the base plate 31.

What is claimed is:

1. A sample holder to be disposed between an electrostatic chuck and a sample being smaller than an upper surface of the electrostatic chuck, comprising:
a base plate formed in the same size as the upper surface of the electrostatic chuck;
a sample placement portion located on an upper surface of the base plate, and designed to place the sample thereon; and
a circumferential portion being a portion of the upper surface of the base plate other than the sample placement portion, and having a conductive material exposed to an outside.

2. The sample holder according to claim 1, wherein the sample placement portion includes a first electrode electrically insulated from the conductive material exposed to the outside in the circumferential portion.

3. The sample holder according to claim 2, wherein the sample placement portion includes an insulating member covering the first electrode.

4. The sample holder according to claim 3, wherein
the sample is made of a conductor or a semiconductor, and
the first electrode generates electrostatic attraction force between itself and the sample by causing electrostatic polarization in the sample.

5. The sample holder according to claim 4, wherein
the base plate is made of a conductor or a semiconductor, and
the first electrode is formed on an insulating film formed on the base plate.

6. The sample holder according to claim 4, wherein
the base plate is made of an insulating material, and
the first electrode is formed on the base plate.

7. The sample holder according to claim 6, wherein
the circumferential portion is covered with an antistatic film made of a conductive material and formed isolated from the first electrode.

8. The sample holder according to claim 6, wherein the sample holder includes a second electrode located on a back surface of the base plate and electrically insulated from the first electrode.

9. The sample holder according to claim 1, wherein the sample holder includes a positioning member located around the sample placement portion and configured to position the sample on the sample placement portion.

10. An electron beam exposure method using a sample holder including:
- a base plate formed in the same size as an upper surface of an electrostatic chuck;
- a sample placement portion being located on an upper surface of the base plate, and designed to place a sample thereon; and
- a circumferential portion being a portion of the upper surface of the base plate other than the sample placement portion, and having a conductive material exposed to an outside, the method comprising the steps of:

placing the sample on the sample holder;

disposing the sample holder with the sample placed thereon on the electrostatic chuck, and fixing the sample holder on the electrostatic chuck by applying a voltage to the electrostatic chuck; and carrying out pattern lithography by irradiating the sample disposed on the electrostatic chuck with an electron beam.

11. The electron beam exposure method according to claim 10, wherein the sample holder further includes a first electrode electrically insulated from the conductive material exposed to the outside in the circumferential portion, and after the step of placing the sample on the sample holder, the method includes the steps of:
- applying a voltage to the first electrode and thereby generating electrostatic attraction force between the first electrode and the sample, and
- conveying the sample holder onto the electrostatic chuck while keeping the attraction state between the first electrode and the sample with electric charges remaining therebetween.

* * * * *